US 6,559,574 B2

(12) United States Patent
Maruyama

(10) Patent No.: US 6,559,574 B2
(45) Date of Patent: May 6, 2003

(54) STACKED ELECTRO-MECHANICAL ENERGY CONVERSION ELEMENT AND VIBRATION WAVE DRIVING DEVICE USING THE SAME

(75) Inventor: Yutaka Maruyama, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/871,626

(22) Filed: Jun. 4, 2001

(65) Prior Publication Data

US 2002/0014810 A1 Feb. 7, 2002

(30) Foreign Application Priority Data

Jun. 5, 2000 (JP) .......................................... 2000-167872

(51) Int. Cl.$^7$ .............................................. H01L 41/08
(52) U.S. Cl. .......................... 310/323.02; 310/323.12; 310/323.16
(58) Field of Search ................. 310/323.02, 323.12, 310/323.16, 328, 366

(56) References Cited

U.S. PATENT DOCUMENTS 5,770,916 A    6/1998  Ezaki et al. ................. 310/366
5,814,919 A *  9/1998  Okumura ................. 310/323.12
6,046,526 A    4/2000  Maruyama ............. 310/323.06
6,051,911 A    4/2000  Kojima et al. ............... 310/323
6,191,520 B1   2/2001  Maruyama et al. ..... 310/323.06

* cited by examiner

Primary Examiner—Mark O. Budd
(74) Attorney, Agent, or Firm—Fitzpatrick, Cella, Harper & Scinto

(57) ABSTRACT

A stacked electro-mechanical energy conversion element includes a plurality of layers made of a material having an electro-mechanical energy conversion function on which a plurality of electrode areas are formed, a first layer having an electro-conductive portion formed from the electrode area to a side face which is a non-stacked surface area, a second layer having a through-hole formed therein by an electro-conductive member, a third layer having an electro-conductive film which communicates the electro-conductive portion of the first layer and the through-hole of the second layer, and an external electro-conductive film formed on the side surface of the first layer so as to communicate with the electro-conductive portion.

9 Claims, 7 Drawing Sheets

FIG. 5A
FIG. 5B
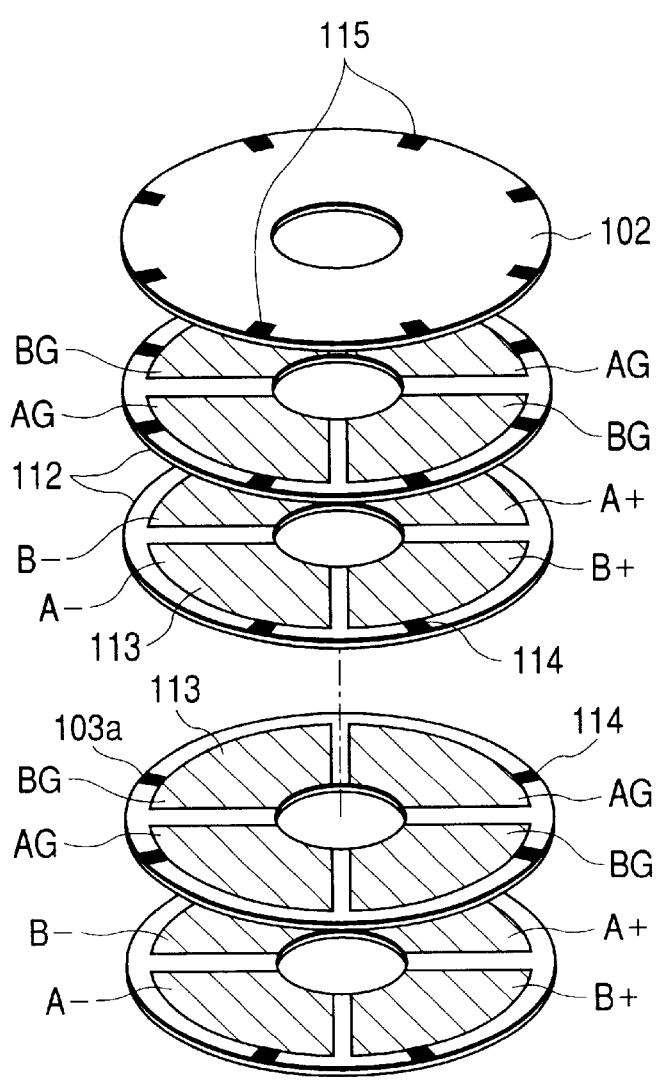
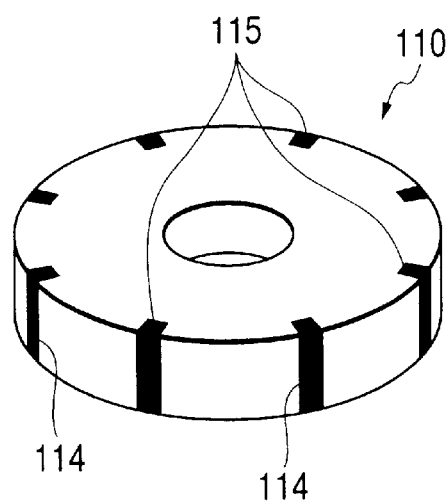

STACKED ELECTRO-MECHANICAL ENERGY CONVERSION ELEMENT AND VIBRATION WAVE DRIVING DEVICE USING THE SAME

BACKGROUND OF THE INVENTION

1. Field of the Invention

The present invention relates to a stacked piezoelectric element for use as a stacked electro-mechanical energy conversion element, which has a configuration particularly suitable for miniaturization.

2. Related Background Art

Conventionally, a piezoelectric material having an electro-mechanical energy conversion function has been used as various types of piezoelectric elements and piezoelectric devices. Particularly, regarding these piezoelectric elements and piezoelectric devices, a recent tendency has been to use, for example, those having a structure constituted by laminating a large number of single plate-like sheets formed by ceramics.

This is because, in contrast to a single plate-like piezoelectric element, through lamination, a large deformation distortion as well as a large power can be obtained with a low applied voltage. In addition, a sheet formation method and a manufacturing method of lamination are so generalized that a thickness of one layer to be laminated can be made thinner, thereby making it easy to obtain the piezoelectric element of a small size and a high performance.

For example, a stacked piezoelectric element for use in a vibration wave motor as a vibration wave drive device is proposed in U.S. Pat. No. 6,046,526 or U.S. Pat. No. 5,770,916. In addition, a large number of stacked piezoelectric elements for use in a vibration gyro and a piezoelectric transformer are also proposed.

With respect to the stacked electro-mechanical elements used for such a variety of applications, those having an electrode area formed in a material having the electro-mechanical energy conversion function, for example, those having a structure constituted by superposing the electrode in a plurality of layers which are formed of an electrode material and disposed on the surface of the piezoelectric ceramics (hereinafter referred to as the internal electrode) are used.

In general, as an inter layer wiring line for connecting one internal electrode of the layers to another having a different laminated state, an electro-conductive film (hereinafter referred to as the external electro-conductive film) used to form a connection is disposed on an outer periphery or an inner periphery of the stacked piezoelectric element, or a hole is disposed inside the layer of a piezoelectric layer in which the electrode material is embedded, thereby defining a through-hole (a via hole).

FIGS. 5A and 5B and FIGS. 6A and 6B show the conventional stacked piezoelectric element described in U.S. Pat. No. 5,770,916. In FIGS. 5A and 5B, a disc-shaped stacked piezoelectric element 110, in the center portion of which a penetration hole is formed, is constituted by the uppermost piezoelectric sheet 102 and a plurality of piezoelectric sheets 112. In one surface (hereinafter referred to as a first surface) of each of a plurality of piezoelectric layers (sheets) 112 constituting the stacked piezoelectric element, there are formed an internal electrode 113. This internal electrode 113 is constituted by an internal electrode pattern having four divided structures which are mutually non-conductive, and a plurality of piezoelectric sheets 112 are laminated in such a manner that the phases of the divided patterns of the internal electrodes 113 correspond to each other. In the outer peripheral portion of each divided pattern of the internal electrode 113, there is formed a connecting pattern 103a and this connecting pattern 103a reaches the outer peripheral end of the piezoelectric sheet 112. At this time, the connecting pattern 103a is located at the same phase in every other piezoelectric sheet 112.

By an external electro-conductive film 114 which is disposed on the outer peripheral surface of the laminated piezoelectric sheet, the connecting pattern 103a of every other piezoelectric sheet 112 is mutually communicated. In the uppermost piezoelectric sheet 102, a surface electrode (a terminal pattern) 115 is formed on its outer peripheral end and communicated with the external electro-conductive film 114.

On the other hand, the stacked piezoelectric elements of FIGS. 6A and 6B obtain communications among laminated piezoelectric layers (sheets) utilizing through-holes. On the surface of each piezoelectric sheet 112 constituting the stacked piezoelectric element 111, there is disposed the internal electrode 113 constituted by the four divided structures, and in the vicinity of the inner peripheral side of each piezoelectric sheet, there are formed through-holes 116 as illustrated in the drawing by black dots. Of the through-holes 116, there are those having communications with the internal electrodes 113 and those having no communications, and in this case, they are mutually located at positions shifted 90 degree in phase. The piezoelectric sheets 112 are laminated in such a manner that the internal electrodes 113 have 90 degree phase difference for every other sheet. In this way, the through-holes 116 located in the same phase are in a state of being alternatively superposed with those having communications with the internal electrodes 113 of the piezoelectric sheets 112 and those not having communications. In every odd number of the piezoelectric sheets 112, internal electrodes which communicate via through-holes 116 are aligned with one another in the axial direction of the stacked piezoelectric element, and in every even number of the piezoelectric sheets 112, internal electrodes which communicate with the through-holes 116 are aligned with one another in the axial direction of the stacked piezoelectric element. In this way, through-holes 116 which communicate with the internal electrodes 113 disposed in every odd number of the piezoelectric sheets 112 are aligned and connected with the non-communicating through-holes 116 of every even number of sheets. Similarly, through-holes 116 which do not communicate with odd numbered sheets are aligned with through-holes 116 which do communicate with even numbered sheets. Each through-hole 116 exposes the end portion of the through hole 116 at the uppermost piezoelectric sheets 102 of the stacked piezoelectric element 111 to form a surface electrode 117.

The stacked piezoelectric elements of FIGS. 5A and 5B and FIGS. 6A and 6B thus constituted are subjected to a polarization process and exhibit piezoelectric efficiencies.

FIG. 7 is a view incorporating the stacked piezoelectric element 110 or 111 into a vibration body 120 constituting a vibration wave motor as a bar-shaped vibration wave driving device. The stacked piezoelectric element 110 (111) is sandwiched between metal parts 121, 122 which are elastic members of the vibration body 120 by a bolt 123 through a wiring substrate 118 to be connected with an external power source. The wiring substrate 118 is electrically connected to each surface electrode 115 (117) of the stacked piezoelectric element 110 (111) and generates a driving vibration attributable to the synthesis of two bending vibrations orthogonal to the vibration body 120. By this driving vibration, a rotor 132 which is brought into press contact with an elastic member 121 by a spring 130 and a spring supporting body 131 is frictionally driven, so that a driving power is output by a gear 133 working as an output member integrally rotating with the rotor 132.

It is to be noted that the stacked piezoelectric element 111 which uses the whole of through-holes for connecting the internal electrodes of FIGS. 6A and 6B has already been mass-produced and come in practice as a motor to be used for the auto-focus of camera lenses incorporated into the vibration wave motor as shown in FIG. 7.

The stacked piezoelectric elements of the external electrode connection system as shown in FIGS. 5A and 5B and the through-hole connection system as shown in FIGS. 6A and 6B are constituted by the electrode portions (patterns) in which the internal electrodes 113 of each layer inside the elements is divided into four parts and, as illustrated in the drawings, are polarized (indicated by +and −) in such a manner that two electrode portions spaced at 180 degree are mutually different in a polarization direction. These are taken as one pair of (A+, A−) and (B+, B−) which are taken as a phase A and a phase B, respectively and, in an opposite layer (hereinafter referred to as a second driving layer) to this one layer (hereinafter referred to as a first driving layer), similarly two electrode portions which are equivalent to ground and spaced at 180 degree are taken as one pair which are taken as a phase AG and a phase BG, respectively. In the same phase of each layer, each electrode portion of the same polarization direction (one another of electrode patterns of the same phase of the above described each first driving layer and one another of electrode patterns of the same phase of the above described each second driving layer) is electrically connected by the through-hole as an inter-layer electrode or the external electro-conductive film. To the phase A and the phase B which is 90 degree different from the phase A in the spatial phase position, a high frequency wave voltage, which is approximately in accord with natural vibration of the vibration body, is applied, and, as the ground, the phase AG and the phase BG opposing to the phase A and the phase B generate two bending vibrations orthogonal to the vibration body.

However, in order to develop a future small-sized vibration wave motor, when an attempt is made to miniaturize the stacked piezoelectric element from the conventional diameter of 10 mm to a diameter of 6 mm, a ratio of the area of the insulating portion (non-electrode forming portion) of the through-hole and its periphery and the whole area of the internal electrode becomes larger than the conventional ratio. As a consequence, an effective area of the piezoelectric activation portion for driving the vibration wave motor is not made larger and a driving efficiency of the motor is not expected to increase appreciably.

Again, when an attempt is made to manufacture the conventional external electro-conductive film as an inter-layer electrode using a low-cost screen printing method, as compared with the case of using through-holes, unevenness tends to develop in the height from the piezoelectric layer surface of the surface electrode 115.

Consequently, in miniaturizing the stacked piezoelectric element, it is considered that there is much room left for improvement in order to achieve both the feature of securing an effective area of the piezoelectric activation portion and maintaining processing accuracy of the surface electrode.

SUMMARY OF THE INVENTION

One aspect of the present invention is to make a stacked electro-mechanical energy conversion element having a piezoelectric layer so as to carry the piezoelectric layer having electro-conductive film for allowing the external electro-conductive film and a through-hole to communicate. In this way, the inter-layer piezoelectric layer is constituted by having the external electro-conductive film, so that the effective area of the piezoelectric activation portion is made larger, and the electrode layer connected with the external power source is constituted by having the through-hole, so that contact accuracy with the external power source can be enhanced.

BRIEF DESCRIPTION OF THE DRAWINGS

FIG. 5A is an exploded perspective view of the stacked piezoelectric element in which the conventional external electro-conductive film is disposed before the formation of the external electrode, and FIG. 5B is a perspective view of a state in which the external electrode is formed;

DESCRIPTION OF THE PREFERRED EMBODIMENTS

First Embodiment

Figure 1A:
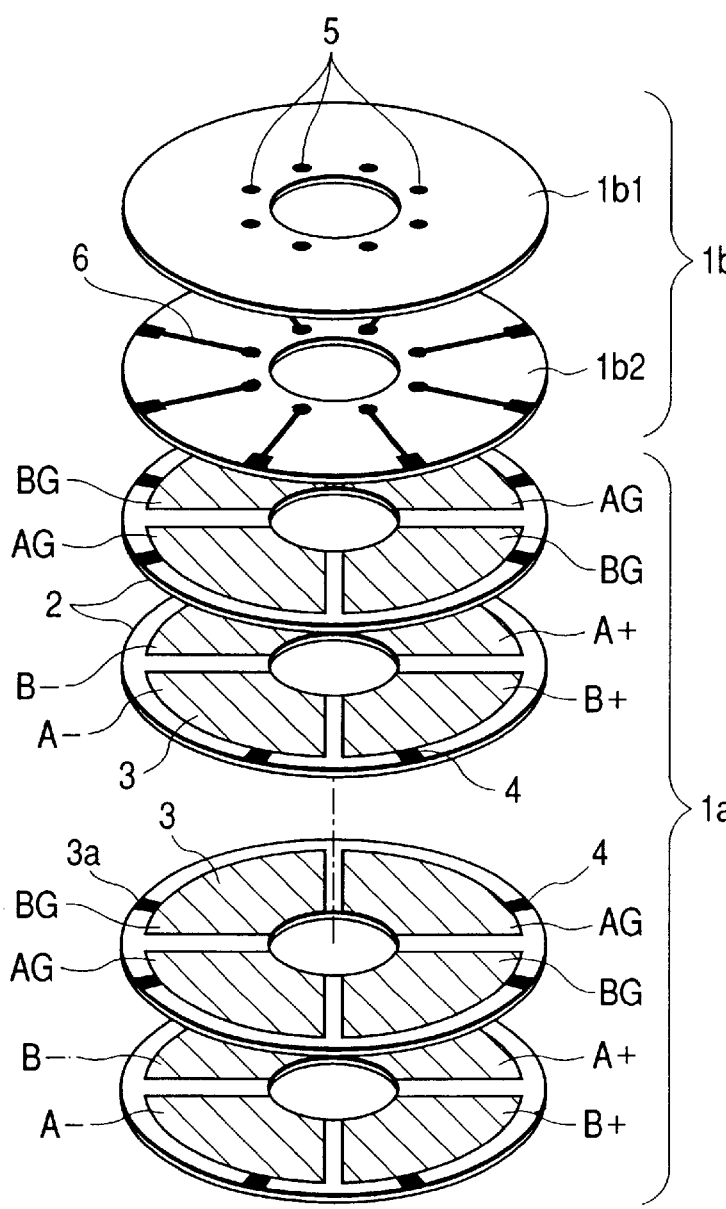
FIG. 1A is an exploded perspective view of a stacked piezoelectric element in a first embodiment before the formation of an external electrode and FIG. 1B is a perspective view of a state in which the external electrode is formed.
Figure 1B:
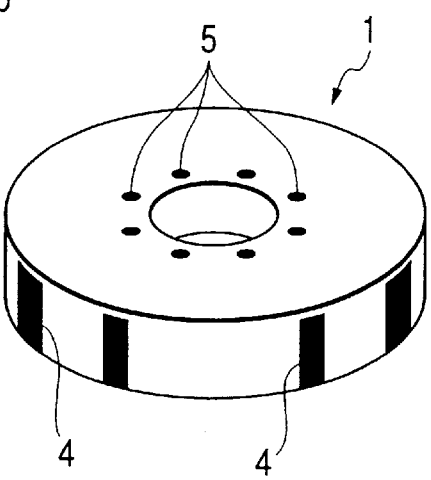

FIGS. 1A and 1B show a first embodiment of the present invention.

A stacked piezoelectric element 1 as a stacked electro-mechanical energy conversion element is constituted by a first stacked piezoelectric element portion 1a and a second stacked piezoelectric element portion 1b. Regarding the first stacked piezoelectric element portion, as similarly shown in FIGS. 5A and 5B, on the outer peripheral portion of each of the four divided internal electrodes 3 formed on the first surface of a piezoelectric layer (sheet) 2, a connecting pattern portion 3a is integrally formed. The connecting pattern portion 3a becomes the same phase as every other piezoelectric sheet (one another of the first driving layers, one another of the second driving layers). Each connecting pattern portion 3a which is axially superposed one on another is communicated by the external electro-conductive film 4 (in the present embodiment, eight pieces are formed).

Figure 6A:
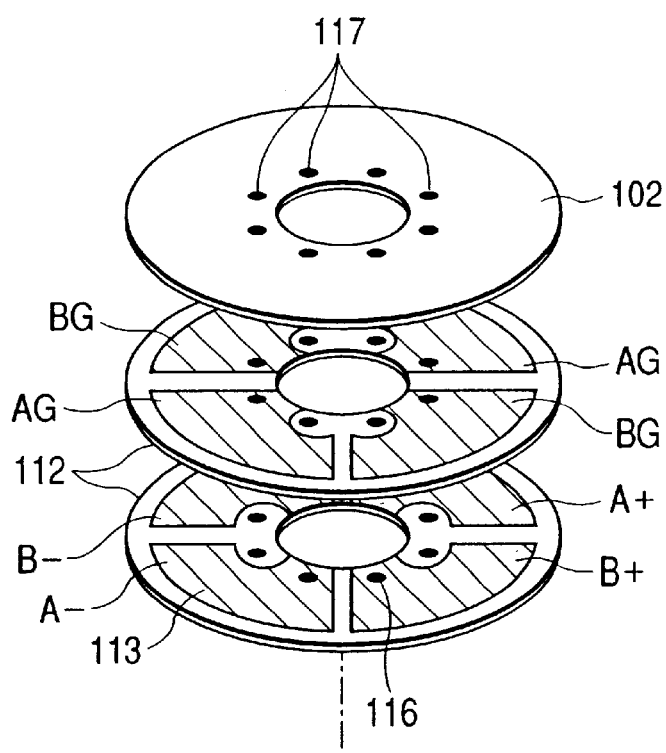
FIG. 6A is an exploded perspective view of the stacked piezoelectric element in which the conventional through-hole is disposed.
Figure 6B:
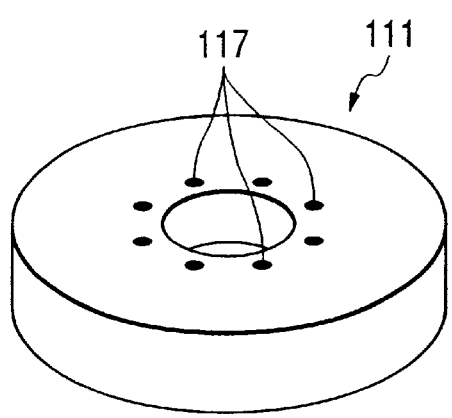
FIG. 6B is a perspective view of an appearance.
Figure 6B:
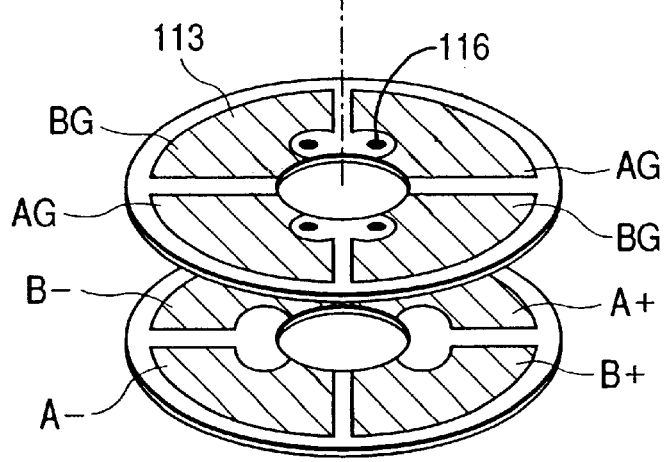
Figure 7:
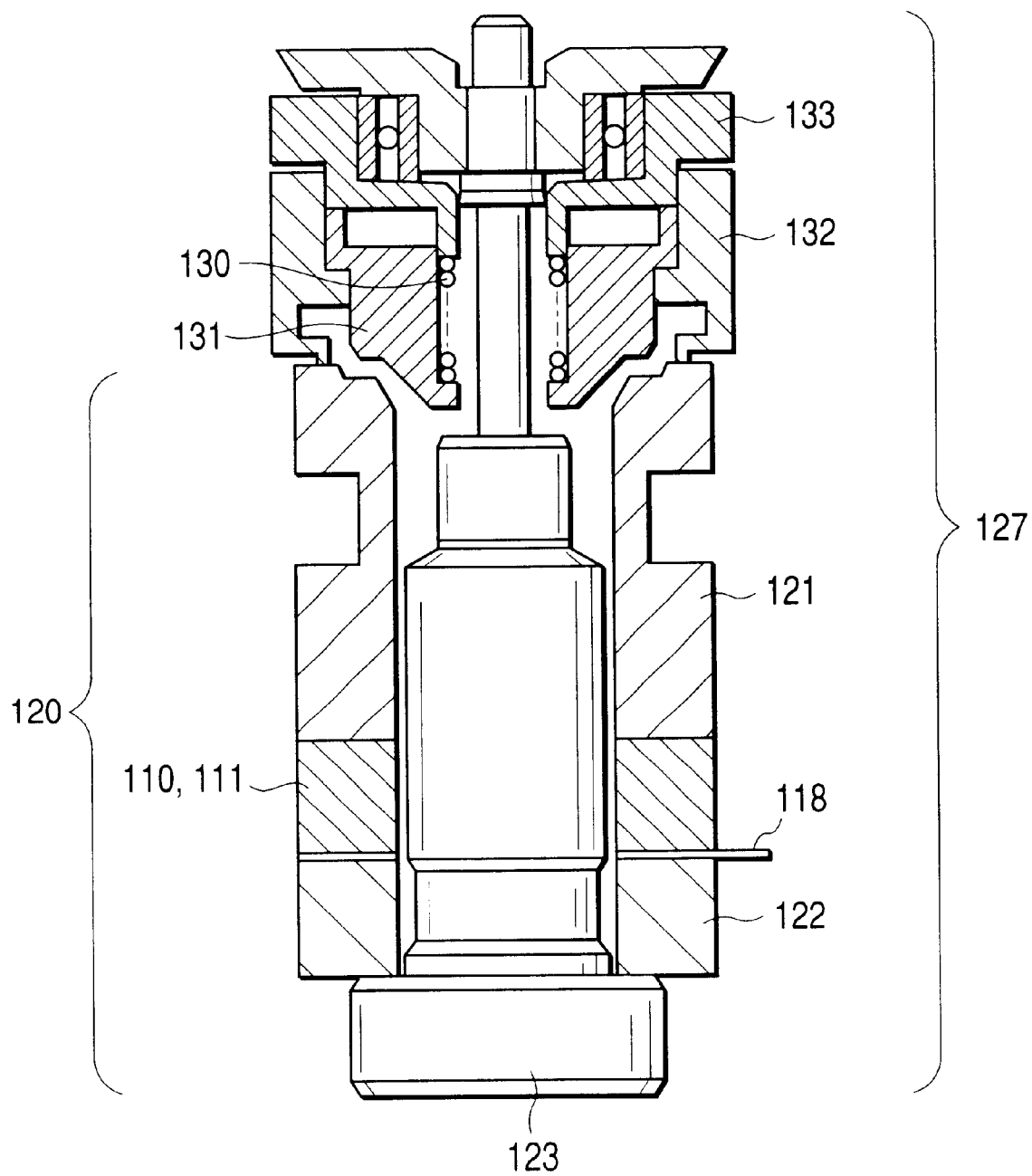
FIG. 7 is a sectional view of the vibration wave motor in which the conventional stacked piezoelectric element is incorporated.

The second stacked piezoelectric element portion 1b is laminated on the first surface side of the first stacked piezoelectric element portion 1a in which this external electro-conductive film is disposed. It is to be noted, regarding the first driving layer and the second driving layer, similar to the conventional examples of FIGS. 5A and 6A, the piezoelectric layer in which the phase A and the phase B are formed is taken as the first driving layer and the piezoelectric layer in which the phase AG and the phase BG are formed is taken as the second driving layer.

The second stacked piezoelectric element portion 1bis a portion in which a surface electrode piezoelectric sheet 1b1 and a wiring piezoelectric sheet 1b2 are laminated, and the wiring piezoelectric sheet 1b2 is laminated so as to be joined to the first surface of the first stacked piezoelectric element portion 1a.

The wiring piezoelectric sheet 1b2 of the second stacked piezoelectric element portion 1b has the wiring electro-conductive films 6 formed on its first surface so as to correspond to the phases of the external electro-conductive films 4 of the first driving layer and the second driving layer of the first stacked piezoelectric element portion 1a (eight pieces in the present embodiment). These wiring electro-conductive films 6 are formed in such a manner as to extend in the radial direction from the outer peripheral side surface to the vicinity of the inner peripheral portion. These wiring electro-conductive films 6 are communicated to the internal electrodes 3 by the respectively corresponding external electro-conductive films 4.

A surface electrode piezoelectric sheet 1b1 of the second stacked piezoelectric element portion 1b, is formed with surface electrodes 5 comprising the through-holes around a hole portion formed in the center portion. This surface electrode 5 is formed in correspondence to each wiring electro-conductive film 6 on the wiring piezoelectric sheet 1b2. The surface electrode 5 is the one in which an electrode material is filled in the through-hole, and this surface electrode 5 is communicated with the inner peripheral side end portion of each wiring electro-conductive film 6 of the wiring piezoelectric sheet 1b2.

That is, each external electro-conductive film 4 from among each electrode pattern of the internal electrode 3 formed in the first surface of each piezoelectric layer 2 allows one another of the corresponding layers (one another of the first driving layers, one another of the second driving layers) to communicate, and at the same time, communicates with each wiring electro-conductive film 6 of the wiring piezoelectric sheet 1b2.

Each wiring electro-conductive film 6 of the wiring piezoelectric sheet 1b2 is communicated with each surface electrode 5 to be constituted by the through-hole of the surface electrode piezoelectric sheet 1b1 laminated on its upper surface.

Figure 3:
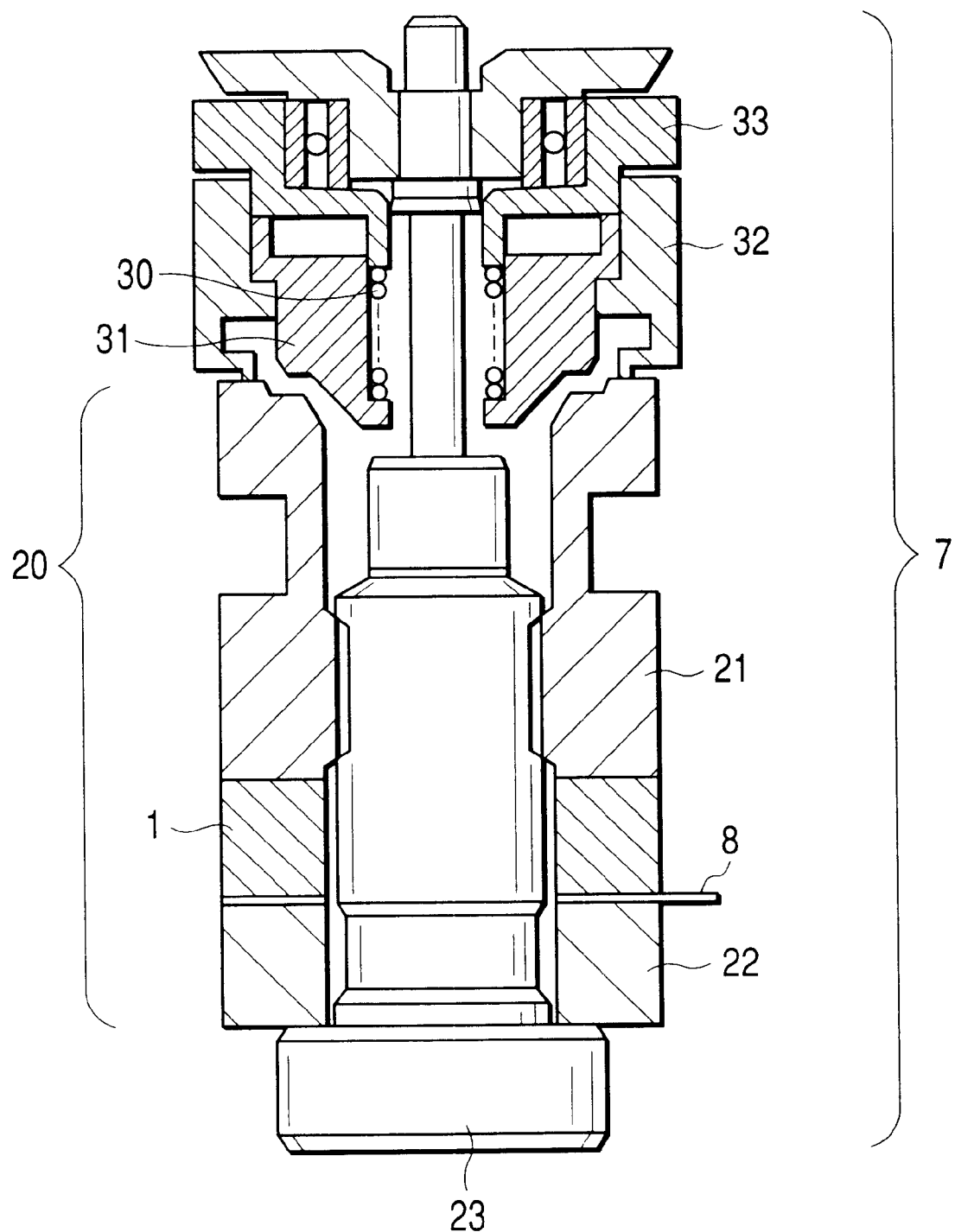
FIG. 3 is a sectional view of a vibration wave motor in which the stacked piezoelectric elements of FIGS. 1A and 1B are incorporated.

In this way, since the stacked piezoelectric element of the present embodiment performs the inter-layer connection of the first stacked piezoelectric element portion 1a by the external electro-conductive film 4, even if a diameter of the element is made smaller, as not in the case of using the above described through-hole, the effective area of the piezoelectric activation portion is not made smaller. Further, since the electrode of the uppermost surface of the stacked piezoelectric element is a surface electrode constituted by the through-hole, in contrast to the case of fabricating the external electrode by the low cost screen printing method, unevenness is hard to occur in the height from the piezoelectric layer surface of the surface electrode. Consequently, as shown in FIG. 3, when it is used in a vibration body of a bar-shaped vibration wave motor, a high contact reliability with a wiring substrate 8 for connection purpose can be obtained.

It is to be noted, though, to fabricate the wiring piezoelectric sheet, a new external electro-conducting film forming apparatus is required, a method of forming the external electro-conductive film by the screen printing method is the cheapest way to fabricate.

The stacked piezoelectric element of the present embodiment was taken as having an outer diameter of 6 mm, an inner diameter of 1.8 mm and a thickness of about 1.4 mm, the piezoelectric layer as having about 55 $\mu$m in a thickness, the wiring electro-conducting film, the internal electrode as having 2 to 3 $\mu$m in a thickness and a total number of layers of the piezoelectric layer as 26 layers.

Further, the diameter of the through-hole constituting the surface electrode 5 of the surface electrode piezoelectric sheet 1b1 is 0.1 mm.

Regarding the fabricating method of the stacked piezoelectric element of the present embodiment, a silver/palladium powder paste which becomes the wiring electro-conductive film 6 and the internal electrode 3 was formed on a green sheet which becomes the piezoelectric layer and which comprises piezoelectric ceramics powder and organic binder by the screen printing method. Similarly, the through-hole was filled with the silver/palladium powder which was superposed one on another and pressurized and laminated while being heated and, after that, sintered at 1100° C. to 1200° C. in a lead atmosphere.

After sintering, the outer peripheral portion was machined and, with a silver electrode paste containing adhesive printed on an outer peripheral curved surface by the screen printing method, the external electrode was hardened at about 80° C. and fabricated.

Finally, for every electrode pattern of the internal electrodes 3, a polarizing process was performed in a specific polarizing direction.

A printing step of the external electro-conductive film 4 can be accomplished in a tact time within five seconds even for every one piece of the stacked piezoelectric element. With respect to the screen printing apparatus for the curved surface, a low cost apparatus having a usual accuracy of position within about ±0.1 mm is enough and even in contrast to the conventional apparatus, the reduction of the manufacturing cost was made possible.

The stacked piezoelectric element 1 of the present embodiment is, as shown in FIG. 3, incorporated into a vibration body 20 constituting a small-sized vibration wave motor 7 in which the diameter of metal parts 21, 22 as elastic bodies is 6 mm, and held between the parts by a bolt 23 through one sheet of the wiring substrate 8 connecting to the external power source and electrically connected also to each surface electrode separately.

The reason why a plurality of through-holes are formed in the inner peripheral side is that the design of the wiring pattern of the wiring substrate 8 is made easy. Furthermore, when driving the motor, the vibration body gives an effective vibration much more to the outer peripheral portion and this is the reason why the through-holes, which become disturbance factors for vibration, are pushed to the inner diameter side as much as possible.

The vibration wave motor 7 frictionally drives a rotor 32 which press contacts an elastic member 21 constituting the vibrating body 20 through a spring 30, a spring supporting body 31, and a driving power is output by a gear 33 as an output member which integrally rotates with the rotor 32.

It is to be noted, in the present embodiment, the internal electrode 3 of the first stacked piezoelectric element portion 1a is divided into four parts in its pattern, and the external electro-conductive film 4 connects each pattern of the four divided parts of the internal electrode 3 for every other layer and a total of eight films 4 are disposed. Further, the same number of surface electrodes 5 respectively communicated is provided, and regarding the wiring electro-conductive film 6, the same number of 8 pieces as the external electro-conductive film 4 is also disposed. The embodiment is not necessarily limited to this. For example, the internal electrode may be divided into two parts, or in one of plural piezoelectric layers, a sensor electrode is provided on a part of the outer periphery of the internal electrode 3, and to this sensor electrode, the external electro-conductive film 4 may be communicated. In this case, the surface electrode 5 and the wiring electro-conductive film 6 are increased by one piece each for the above described sensor electrode.

Second Embodiment

Figure 2A:
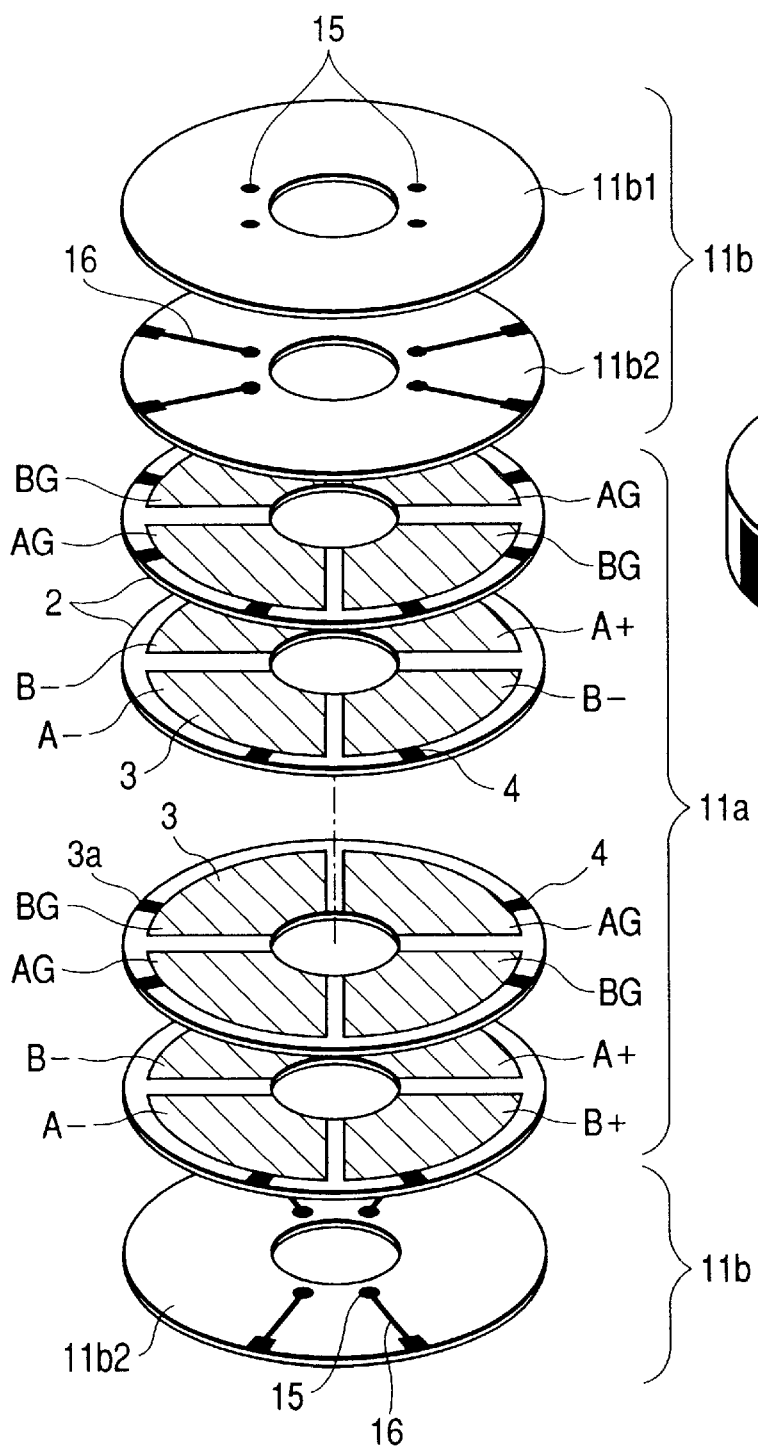
FIG. 2A is an exploded perspective view of a stacked piezoelectric element in a second embodiment before the formation of the external electrode and FIG. 2B is a perspective view of a state in which the external electrode is formed.
Figure 2B:
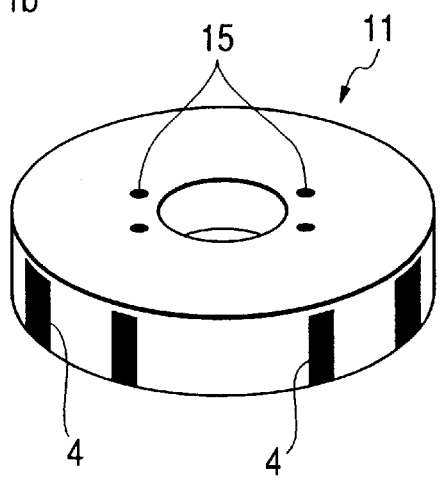

FIGS. 2A and 2B show a second embodiment of the present invention.

As shown in FIG. 2A, though the configuration of a first stacked piezoelectric element portion 11a is the same as that of the first embodiment, there exists a difference which is that second stacked piezoelectric element portions 11b are disposed axially on both sides of the first stacked piezoelectric element portion 11a. Although the second stacked piezoelectric element portions 11b are basically the same as the second stacked piezoelectric element portion 1b in their configurations, they differ in that four external electro-conductive films 4 of a second driving layer (a piezoelectric layer having a phase AG, a phase AB) are connected to one of the second stacked piezoelectric element portions 11b arranged upward in the drawing and four external electro-conductive films 4 of a first driving layer (a piezoelectric layer having polarizing process portions A+, A−, B+and B−) are connected to the other of the second stacked piezoelectric element portions 11b arranged downward in the drawing, respectively.

The second stacked piezoelectric element 11b is formed by stacking on one another a surface electrode piezoelectric sheet 11b1 having four surface electrodes 15 as through holes formed circumferentially and a wiring electro-conductive piezoelectric sheet 11b2 having four wiring electro-conductive films 16 formed radially. The wiring electro-conductive piezoelectric sheet 11b1 of one of the second stacked piezoelectric element portions 11b is laminated so as to be joined to the first surface of the first stacked piezoelectric element portion 11a, and the wiring electro-conductive film piezoelectric sheet 11b2 of the other of the second stacked piezoelectric element portions 11b is laminated so as to be joined to the second surface (the lowest surface which is a surface opposite to the surface in which the electrode of the piezoelectric layer of the lowest layer is disposed) of the first stacked piezoelectric element portion 11a.

That is, the stacked piezoelectric element of the present embodiment was constituted in such a manner that the surface electrodes 15 comprising the through-holes are disposed in the uppermost layer and the lowest layer by opening holes in the piezoelectric layers in which an electrode material is filled and, in addition, the wiring electro-conductive films 16 are disposed and, on the uppermost layer and the lowest layer, that is, on the upper and lower end faces of the stacked piezoelectric elements, the surface electrodes are disposed.

Figure 4:
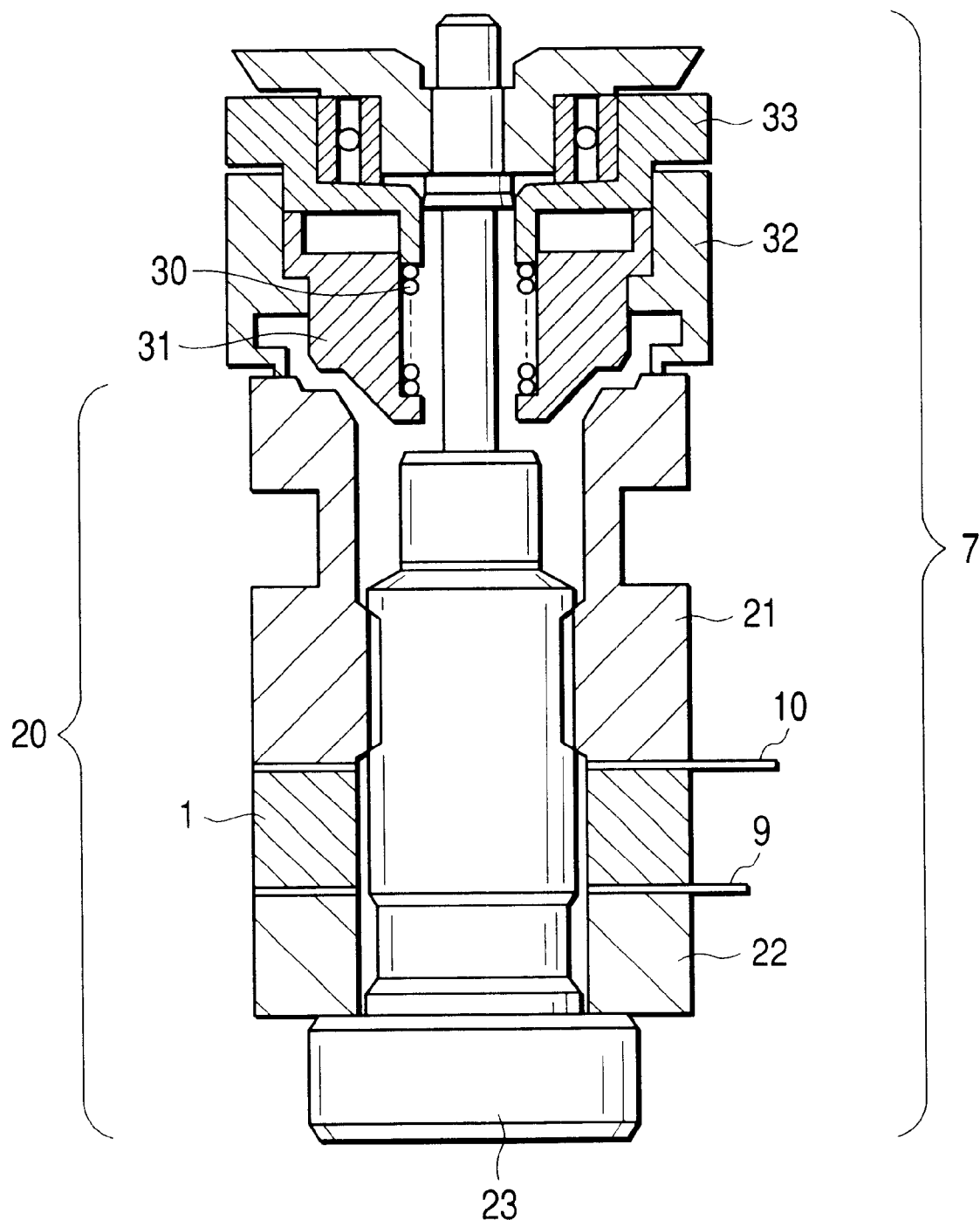
FIG. 4 is a sectional view of the vibration wave motor in which the stacked piezoelectric elements of FIGS. 2A and 2B are incorporated.

According to the present embodiment, in the case of miniaturizing the diameter and the like of a stacked piezoelectric element much more than conventionally, since plural pieces of surface electrodes are disposed on each upper and lower end surface, when they are incorporated into a vibration body of a vibration wave motor 7 whose metal parts 21, 22 have a diameter of 6 mm, as shown in FIG. 4, a wiring substrate is divided into two sheets: 9 and 10. For this reason, the width of the wiring line of the wiring substrate can be made wider so as to permit a larger electric current flow, and as a result it became possible for the electric power which can be input to the vibration wave motor to be made larger by that much.

It is to be noted that the fabricating method of the stacked piezoelectric element and the configuration of the internal electrode 3 of the present embodiment are basically the same as those of the above described first embodiment. However, the number of layers of the piezoelectric layer is taken as 27 layers, and though the lowest layer comprises the wiring electro-conductive film 16 and the surface electrode 15, an increase of the manufacturing cost thereof was suppressed just below 10%.

It is to be noted, in both the first and the second embodiments, though the external electrodes are disposed on the outer peripheral surfaces corresponding to the outer diameter of the stacked piezoelectric element, needless to mention, one or plural numbers of the electrodes may be disposed on the inner peripheral surface of the inner diameter portion. Although the above described example was related to the stacked piezoelectric element for use as a bar-shaped vibration wave motor, this is the invention which can be similarly used in the stacked piezoelectric element for use as a ring-shaped vibration wave motor.

As described above, according to the first embodiment and the second embodiment, the miniaturization of the stacked piezoelectric element can secure an effective activation portion as the piezoelectric element and, in addition, have an effect capable of reducing a manufacturing cost, while maintaining the usual reliability of the connection with the wiring substrate which supplies the electric power.

What is claimed is:

1. A stacked electro-mechanical energy conversion element comprising:
   at least one first layer made of a non-conductive material having an electro-mechanical energy conversion function on which a plurality of electrode areas are formed and having respective electro-conductive portions formed thereon from said electrode areas to an outer peripheral edge thereof;
   a second layer made of a non-conductive material and having through-holes filled with a conductive material;
   a third layer made of a non-conductive material and having electro-conductive film portions which electrically communicate the electro-conductive material of respective through-holes of said second layer to the peripheral edge thereof; and
   external electro-conductive film portions formed on the peripheral side surface of said at least one first layer so as to electrically communicate the electro-conductive film poritons of said third layer with said electro-conductive portions of said at least one first layer.

2. The electro-mechanical energy conversion element according to claim 1, wherein said third layer is sandwiched between said at least one first layer and said second layer.

3. The electro-mechanical energy conversion element according to claim 1, wherein one end of each electro-conductive film portion is connected to an electro-conductive portion of said first layer and a respective other end of said electro-conductive film portion is connected to the conductive material of a through-hole of the second layer.

4. A stacked electro-mechanical energy conversion element having a penetration hole formed in a center portion thereof, comprising:

at least one first layer made of a non-conductive material having an electro-mechanical energy conversion function and a plurality of electrode areas and respective electro-conductive portions formed on a surface thereof from said plurality of electrode areas to at least one of an inner peripheral edge and an outer peripheral edge thereof;

a second layer made of a non-conductive material and having through-holes filled with a conductive material;

a third layer made of a non-conductive material and disposed adjacent to said first layer and said second layer, said third layer having electro-conductive film portions formed on a surface thereof and electrically communicating the conductive material of respective through-holes of said second layer to at least one of an inner peripheral edge and an outer peripheral edge thereof; and external electro-conductive film portions formed on at least one of an inner peripheral side surface and an outer peripheral side surface of said at least one first layer so as to electrically communicate said electro-conductive film portions of said third layer with said electro-conductive portions of said at least one first layer.

5. The stacked electro-mechanical energy conversion element according to claim 4, wherein alternating signals are supplied to said through-holes by an external power source.

6. A stacked electro-mechanical energy conversion element comprising:

a plurality of layers made of a non-conductive material having an electro-mechanical energy conversion function on which a plurality of electrode areas are formed, where each of the plurality of layers has respective electro-conductive portions formed on said layer from said electrode areas to an outer peripheral edge thereof;

external electro-conductive film portions formed on peripheral side surfaces of said plurality of layers and electrically connected to the respective electro-conductive portions of said plurality of layers;

a layer made of a non-conductive material and having through-holes filled with a conductive material as electrodes for applying alternating signals; and a layer which forms electro-conductive film portions electrically connecting said external electro-conductive film portions and the conductive material of said through-holes.

7. The stacked electro-mechanical energy conversion element according to claim 6, wherein each of said plurality of layers having an electro-conductive electrode portion comprises four divided electrode areas in the same phase, and alternating signals of different phases are applied to opposing electrode areas of said four divided electrode areas, thereby exciting bending vibrations of different phases.

8. A vibration wave driving apparatus in which an alternating signal is applied to a stacked electro-mechanical energy conversion element sandwiched between elastic bodies to generate a driving vibration in the elastic bodies and rotate a movable body by the driving vibration, comprising:

at least one first layer made of a non-conductive material having an electro-mechanical energy conversion function and having a plurality of electrode areas and respective electro-conductive portions formed on a surface thereof from said electrode areas to an outer peripheral edge thereof;

a second layer made of a non-conductive material and having through-holes filled with a conductive material;

a third layer made of a non-conductive material and having electro-conductive film portions which electrically communicate the conductive material of the through-holes of the second layer to an outer peripheral edge thereof; and external electro-conductive film portions formed on a peripheral side surface of said at least one first layer so as to electrically communicate the electro-conductive film portions of said third layer with said electro-conductive portions of said at least one first layer.

9. A vibration wave driving apparatus in which an alternating signal is applied to a stacked electro-mechanical energy conversion element sandwiched between elastic bodies to generate a driving vibration in the elastic bodies and rotate a movable body by the driving vibration, comprising:

a plurality of layers each made of a non-conductive material having an electro-mechanical energy conversion function and having electrode areas formed on a surface thereof and respective electro-conductive portions formed on the surface thereof from said electrode areas to a peripheral edge thereof;

external electro-conductive film portions formed on outer peripheral side surfaces of said plurality of layers and electrically connecting said electro-conductive portions of said plurality of layers;

a layer made of a non-conductive material and having through-holes filled with a conductive material as electrodes for applying alternating signals; and a layer which forms electro-conductive film portions electrically connecting said external electro-conductive film portions and the conductive material of said through-holes.

* * * * *

UNITED STATES PATENT AND TRADEMARK OFFICE
CERTIFICATE OF CORRECTION

PATENT NO.   : 6,559,574 B2
DATED        : May 6, 2003
INVENTOR(S)  : Yutaka Maruyama It is certified that error appears in the above-identified patent and that said Letters Patent is hereby corrected as shown below:

<u>Column 5,</u>
Line 11, "1bis" should read -- 1b is --.

<u>Column 8,</u>
Line 63, "poritons" should read -- portions --.

Signed and Sealed this

Thirtieth Day of December, 2003

JAMES E. ROGAN
*Director of the United States Patent and Trademark Office*